(12) United States Patent
Choy et al.

(10) Patent No.: US 8,542,037 B2
(45) Date of Patent: *Sep. 24, 2013

(54) MULTI-LEVEL HIGH VOLTAGE PULSER INTEGRATED CIRCUIT USING LOW VOLTAGE MOSFETS

(75) Inventors: Ben Choy, San Jose, CA (US); Ching Chu, Cupertino, CA (US)

(73) Assignee: Supertex, Inc., Sunnyvale, CA (US)

( * ) Notice: Subject to any disclaimer, the term of this patent is extended or adjusted under 35 U.S.C. 154(b) by 32 days.

This patent is subject to a terminal disclaimer.

(21) Appl. No.: 13/355,749

(22) Filed: Jan. 23, 2012

(65) Prior Publication Data

US 2013/0187697 A1    Jul. 25, 2013

(51) Int. Cl.
*H03K 3/00* (2006.01)
(52) U.S. Cl.
USPC ............. 327/108; 327/112; 327/381; 326/27; 326/82
(58) Field of Classification Search
USPC ......... 327/108, 110–112, 380–381, 427–429, 327/434, 436–437; 326/25–27, 82–84, 87
See application file for complete search history.

(56) References Cited

U.S. PATENT DOCUMENTS 7,659,754 B2 *   2/2010   Thiele et al. .................. 327/108
7,956,653 B1 *   6/2011   Choy et al. .................... 327/108

* cited by examiner

*Primary Examiner* — An Luu
(74) *Attorney, Agent, or Firm* — Weiss & Moy. P.C.; Jeffrey D. Moy

(57) ABSTRACT

A multi-level high-voltage pulse generator integrated circuit has a digital logic-level control interface circuit. A pair of complementary MOSFETs is controlled by the digital control interface circuit. A pair of supply voltage rails is provided, wherein one of the pair of supply voltage rails is connected to each of the pair of complementary MOSFETs. A pair of Zener diodes is provided, wherein one of the pair of Zener diodes is connected to each of the pair of complementary MOSFETs. A pair of resistors is provided, wherein one of the pair of resistors is connected in parallel with each of the pair of Zener diodes. A pair of complementary voltage blocking-MOSFETs having predetermined gate bias voltages is provided, wherein each of the pair complementary voltage blocking-MOSFETs is attached to a corresponding one pair of complementary MOSFETs.

11 Claims, 3 Drawing Sheets

US 8,542,037 B2

MULTI-LEVEL HIGH VOLTAGE PULSER INTEGRATED CIRCUIT USING LOW VOLTAGE MOSFETS

BACKGROUND

This invention relates to a multi-level high-voltage ultrasound transmit pulser integrated circuit for medical ultrasound scanning image system, and more particularly, to an array of high voltage switches for a high-voltage output pulse generator for exciting the piezoelectric or capacitive-electrostatic elements in the ultrasound transducer probe in an ultrasound medical B-scan and a color image system.

Ultrasound medical imaging applications have a growing demand for more sophisticated excitation waveforms and sequential scanning methods for large number of piezoelectric or capacitive-electrostatic element arrays. The commonly used ultrasound transmit pulse generator generally consists of three or more pairs of P-type and N-type high voltage power MOSFETs driven by a very fast and powerful gate driver circuit. Each channel of the pulse generator needs to produce high voltage and high current to charge or discharge the load capacitance at ultrasound frequency or speed. The load capacitance of the piezoelectric or capacitive-electrostatic elements and the cable equivalent capacitance together usually are quite large, and the ultrasound frequency is in 1 to 20 MHz or higher frequency range. The transmitter pulser requires large output current; therefore it requires large MOSFET sizes. The advanced color Doppler ultrasound imaging systems further require that the waveform generated from this pulse generator contain multiple voltage-levels, in clouding the zero-level or near zero voltage levels. Further each IC has to built-in multiple channels of pulse generators. For examples, the dual, quad, octal-channel, even 16 or 32 channels need to be built-in one IC package.

Therefore, it would be desirable to provide a system and method that overcomes the above issues. It would further be desirable to provide a high-voltage transmit pulse generating circuit topology and method that uses the lower-voltage, low-cost but high-current, higher-speed large scale integrating semiconductor process.

SUMMARY

A multi-level high-voltage pulse generator integrated circuit has a digital logic-level control interface circuit. A pair of complementary MOSFETs is controlled by the digital control interface circuit. A pair of supply voltage rails is provided, wherein one of the pair of supply voltage rails is connected to each of the pair of complementary MOSFETs. A pair of Zener diodes is provided, wherein one of the pair of Zener diodes is connected to each of the pair of complementary MOSFETs. A pair of resistors is provided, wherein one of the pair of resistors is connected in parallel with each of the pair of Zener diodes. A pair of complementary voltage blocking-MOSFETs having predetermined gate bias voltages is provided, wherein each of the pair complementary voltage blocking-MOSFETs is attached to a corresponding one pair of complementary MOSFETs.

The features, functions, and advantages can be achieved independently in various embodiments of the disclosure or may be combined in yet other embodiments.

BRIEF DESCRIPTION OF THE DRAWINGS

Embodiments of the disclosure will become more fully understand from the detailed description and the accompanying drawings, wherein.

DETAILED DESCRIPTION

Figure 1:
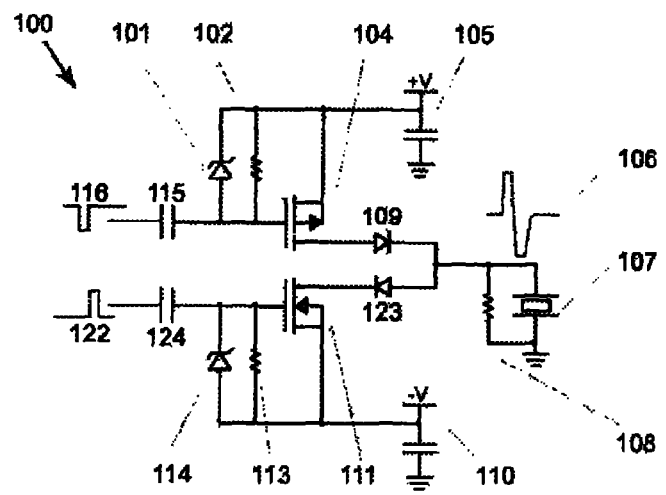
FIG. 1 is a schematic diagram illustrating a conventional prior art complementary MOSFETs ultrasound transmitter pulse generator in a typical ultrasound B-scan image system.

Referring to FIG. 1, a schematic diagram illustrating a conventional prior art complementary MOSFETs ultrasound transmitter pulse generator 100 (hereinafter generator 100) is shown. In the generator 100, the sources of P-type MOSFET 104 and N-type MOSFET 111 may be connected to the positive and negative high voltage power supply rail 105 and 110 respectively. The gates of the P-type MOSFET 104 and N-type MOSFET 111 may be connected to the gate coupling capacitors 115 and 124 respectively. The gate coupling capacitors 115 and 124 may be driven by the control waveforms 116 and 122 respectively which may be generated by gate-driver circuits.

Between the gates of the P-type MOSFET 104 and N-type MOSFET 111 and the supply voltage rails 105 and 110 there are Zener diodes 101 and 114, and in paralleled with the gate-source DC bias voltage resistors 102 and 113. The forward direction of the Zener diodes 101 and 114 are severed as the fast DC restoring diodes function for the AC capacitor coupling, while the Zener diodes break-down direction protecting the possible over voltage of MOSFET gate to source voltages. The switching diodes 109 and 123 block the revise voltage as well as isolate the ultrasound receiver from the transmitter. In the 2-level transmit pulse generator circuit the resistor 108 in parallel with the transducer 107, discharge the capacitance of the transducer after the waveform transmitted. A typical waveform 106 is shown in the FIG. 1. The voltage rating of the MOSFETs 104 and 111 in this prior art have to be at least the same voltage range of from +V to −V.

In the advanced ultrasound medical imaging system, it is required to generate a high-voltage and multiple voltage-levels, including the zero or a near-zero voltage level pulses. It also requires providing such a circuit of multiple channels in a single IC package. Therefore it is a challenge to provide a semiconductor process to design and manufacture a high-voltage (+/−100V to +/−200V or higher) and high speed (sub nanosecond to 10 s nanosecond pulse rising and falling time), and to meet the low cost, small in size ICs for the medical ultrasound image system needs. Normally the maximum-speed and maximum-voltage of a given process are limited. And further more, the processes can work with higher-voltage (higher BV) but usually come with lower-speed and/or larger in size. So there is need of a circuitry topology or method to use the lower BV semiconductor process or technology to design and manufacture the high speed integrated circuits (ICs) with higher voltage pulses output and with relatively high integration density.

Figure 2:
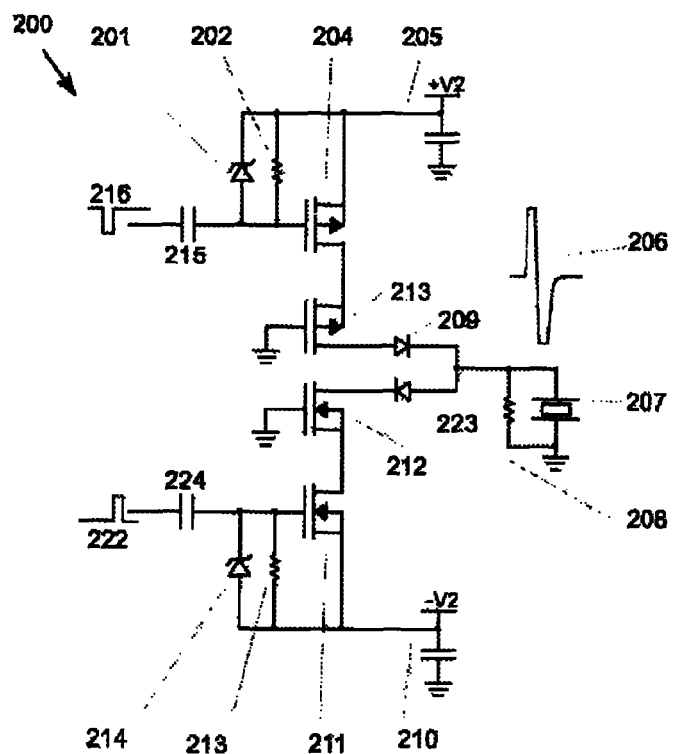
FIG. 2 is a schematic diagram illustrating the proposed new circuit architecture topology of the transmit pulse generate channels for the basic two-level ultrasound transducer excitation waveform integrated device circuit using lower-voltage MOSFETs.

Referring to FIG. 2, a novel circuit topology is shown for a 2-level high voltage ultrasound-transmit pulser integrated circuit 200. As shown in FIG. 2, the sources of the P-type MOSFET 204 and N-type MOSFET 211 may be connected to the positive 205 and negative 210 high voltage power supply rails respectively. The gates of the P-type MOSFET 204 and N-type MOSFET 211 may be connected to the gate coupling capacitors 215 and 224 respectively. The gate coupling capacitors 215 and 224 may be driven by the control waveforms 216 and 222 respectively. The control waveforms 216 and 222 may be generated by the gate-driver circuits. Between the gates of the P-type MOSFET 204 and N-type MOSFET 211 and the supply voltage rails 205 and 210 respectively may be Zener diodes 201 and 214, and in paralleled with the gate-source DC bias voltage resistors 202 and 213. The Zener diodes 201 and 214 may served the same function as they do in FIG. 1.

Similar to FIG. 1, the output of circuit 200 may have switching diodes 209 and 223, and a resistor 208 in parallel with the transducer 207. A typical waveform 206 is shown in the FIG. 1.

In FIG. 2 two depletion or enhance or enhance complementally P & N-type of low-voltage blocking MOSFET devices 212 and 213, are added in serial with the drains of MOSFETs 204 and 211 respectively and the output circuit. Thus the drains of MOSFET drains 204 and 211 may be connected to the sources of MOSFETs 212 and 213 respectively while the drains of MOSFETs 212 and 213 may be coupled to the output circuit. The gates of the MOSFET 212 and 213 may be connected to zero voltage ground or a predetermined near-zero voltages.

This new configuration or circuit topology provides higher break-down voltage (BV) of the pulse-generator circuit 200. For example, by using +/−50V BV IC process, one can design near +/−100V of output pulse generate circuit.

Figure 3:
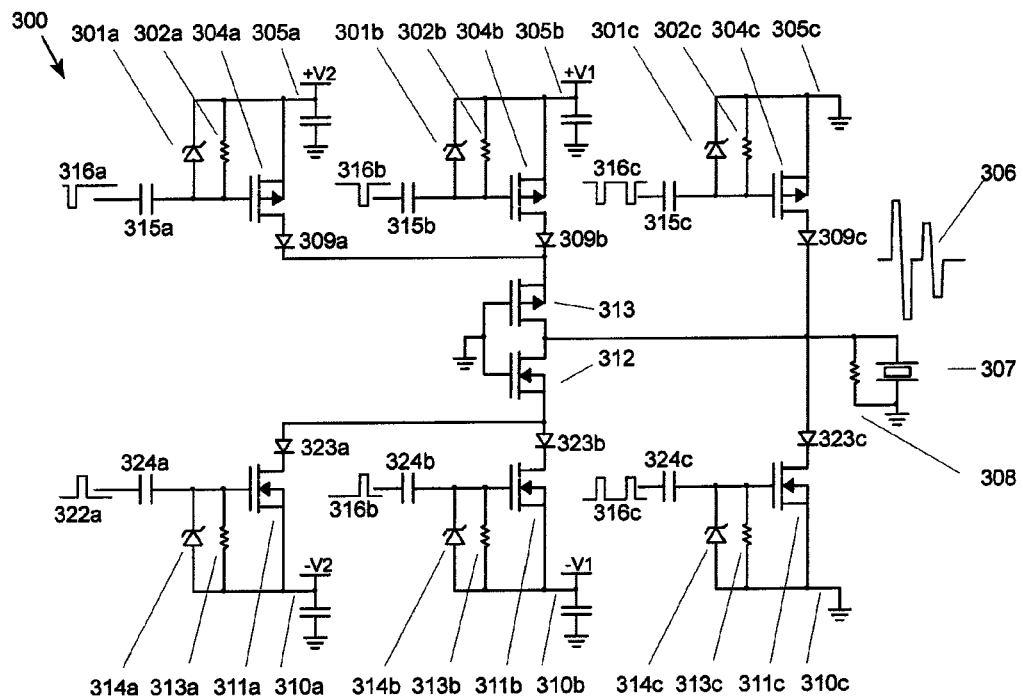
FIG. 3 is the schematic diagram illustrating the proposed new circuit architecture topology of a single channel of the 5-level, AC-coupling gate driving ultrasound transmit pulser generator integrated device circuit.

Referring now to FIG. 3, a 5-level ultrasound transmit pulse generator circuit 300 (hereinafter circuit 300) is illustrated. The circuit 300 uses the supply voltage rails of 305a and 310a, together with the supply voltage rails of 305b and 310b and the ground level 305c and 310c, to generate the 5 voltage levels in the 5-level waveforms.

As shown in FIG. 3, a plurality of pairs of MOSFETs may be used. In the embodiment shown in FIG. 3, the circuit 300 uses three pairs of MOSFETS P-type MOSFETs 304a, 304b, and 304c and N-type MOSFETs 311a, 311b, and 311c. The sources of the P-type MOSFETs 304a, 304b, and 304c may be connected to the positive voltage rails 305a, 305b, and 305c respectively and the sources of N-type MOSFETs 311a, 311b, and 311c may be connected to negative voltage rails 310a, 310b, and 310c respectively. The gates of the P-type MOSFETs 304a, 304b and 304c may be connected to the gate coupling capacitors 315a, 315b and 315c respectively. While the gates of the N-type MOSFETs 311a, 311b and 311c may be connected to the gate coupling capacitors 324a, 324b and 324c respectively. The gate coupling capacitors 315a, 315b, 315c, 324a, 324b and 324c may be driven by the control waveforms 316a, 316b, 316c, 322a, 322b and 322c respectively. The control waveforms 316a, 316b, 316c, 322a, 322b and 322c may be generated by the gate-driver circuits.

Between the gates of the P-type MOSFETs 304a, 304b and 304c and their respective supply voltage rails 305a, 305b and 305c may be Zener diodes 301a, 301b and 301c respectively in parallel with the gate-source DC bias voltage resistors 302a, 302b and 302c respectively. The gates of the N-type MOSFETs 311, 311b and 31c and their respective supply voltage rails 310a, 310b and 310c may be Zener diodes 314a, 314b and 314c respectively in parallel with the gate-source DC bias voltage resistors 313a, 313b and 313c respectively.

Diodes 309a, 309b, 309c, 323a, 323b, and 323c may be connected to the drains of MOSFETS 304a, 304b, 304c, 311a, 311b and 311c respectively.

When the MOSFETs 304c and 311c are turned on, the circuit load 307 and 308 may be discharged to zero level and the "return to zero" (RTZ) or damping function is provided. It is because the sources of 304c and 305c MOSFETs may both connect to zero volt (ground). Furthermore the drain of MOSFET 304c via the diode 309c may be directly connected to the output. MOSFETs 304C and 311C drain to source voltage rating only need be half of the maximum voltage rating of output pulse peak to peak voltages. The drain of 311c via diode 323c may be directly connected to the output. The typical waveform this circuit can be generated is shown as waveform 306 in the FIG. 3.

It is obverse that the complementary pair 313 P-type and 312 N-type depletion or enhance or enhance MOSFETs, the gate to source break-down voltages may be required to be high enough for the maximum peak to peak voltages. Therefore all the drain to source voltage rating of every MOSFET in FIG. 3 only need be the half of the output waveform maximum swing peak to peak voltage ranges.

Figure 4:
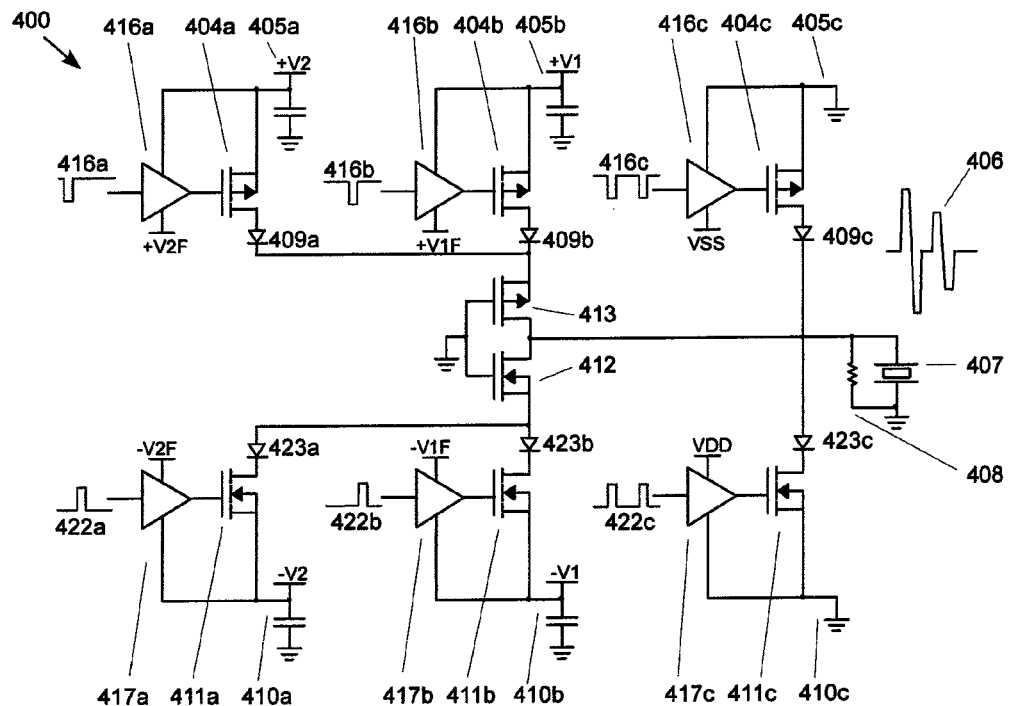
FIG. 4 is a schematic detail diagram illustrating the further proposed new circuit architecture topology of the ultrasound pulse generator use floating gate drivers.

Referring now to FIG. 4, an alternative multi-level high voltage ultrasound transmit pulser integrated circuit 400 (hereinafter circuit 400) is shown. The circuit 400 is similar to that in FIG. 3 but element reference numbers are now 400 series instead of 300 series. In the present embodiment direct-coupling gate drivers 416a, 416b, 416c, 417a, 417b, and 417c may be used for each of the MOSFETs 404a, 404b, 404c, 411a, 411b and 411C respectively. Besides the coupling circuits 416a, 416b, 416c, 417a, 417b, and 417c, the main output and cascode voltage blocker depletion or enhance MOSFETs circuitry are same as in the FIG. 3.

Figure 5:
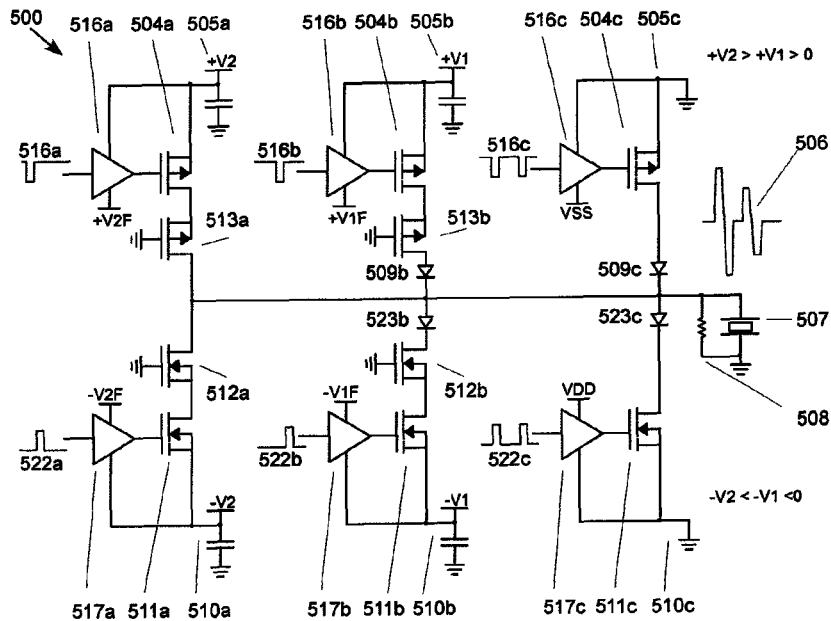
FIG. 5 is a schematic detail diagram illustrating the further proposed new circuit architecture topology of the ultrasound pulse generator with independent voltage-blocker MOSFETs and the floating gate drivers.

Referring now to FIG. 5, an alternative gate-coupling method of the proposed novel multi-level high voltage ultrasound transmit pulser integrated circuit 500 (hereinafter circuit 500) is shown. The circuit 500 is similar to that in FIG. 4 but element reference numbers are now 500 series instead of 300 series. Circuit 500 use independent high voltage blocker MOSFET pairs 513a & 512a, 513b & 512b and 513c & 512c. Under the power supply condition of (+V2>+V1>0) and (−V2<−V2<0), the diode pair 509a and 523a could be eliminated. Only the 509b, 523b, 509c and 523c are needed. The cascode circuits with voltage-double capability have provide by the case-code MOSFETs 504a,b & 513a,b and 511a,b &512a,b. The gate bias voltage of MOSFETs 512a,b and 513a,b may all be using zero volt. If the output swing is symmetric and the maximum output waveform voltages of the proposed circuit are supplied by the +/−V2, then all the MOSFETs voltage rating only need be half of the voltage from +V2 to −V2.

Figure 6:
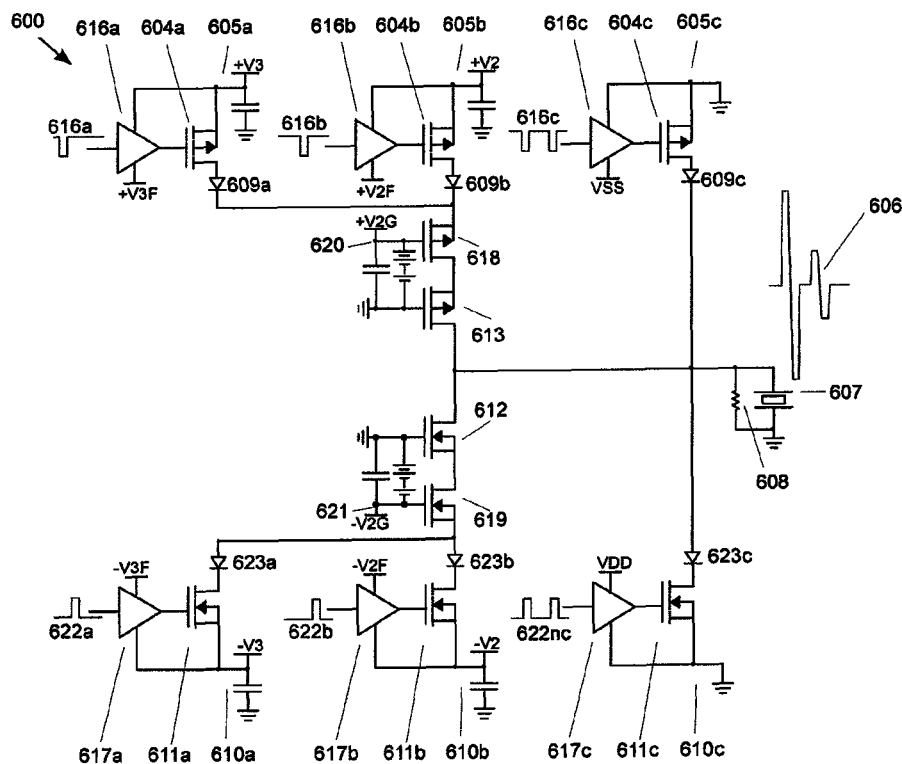
FIG. 6 is a schematic detail diagram illustrating the further proposed new circuit architecture topology of the ultrasound pulse generator with 2-order cascode voltage blocker MOSFETs and the floating gate drivers.

Referring now to FIG. 6, a multi-level high voltage ultrasound transmit pulser integrated circuit 600 (hereinafter circuit 600) is shown. The circuit 600 is similar to previous embodiments but element reference numbers are now 600 series. The circuit 600s uses a 2-order cascode circuit with even higher peak to peak output capability. The case-code MOSFETs 618 & 613 may be using the zero volte and +/−V2G gate bias voltages 620 and 621. If the output swing is symmetric and the maximum output waveform voltages of the proposed circuit are supplied by the +/−V3, then the MOSFETs voltage rating of 604a, 604b, 618, 613, 612, 619, 611a and 611b only need be one third of the voltage from +V3 to −V3. The voltage rating of the MOSFETs 604c and 611C only need be half of the voltage from +V3 to −V3. In above condition, the gate bias voltages of MOSFETs 618 and 619 should be about two-third of the +V3 and −V3 from ground respectively.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A multi-level high-voltage pulse generator integrated circuit comprising:
   a digital logic-level control interface circuit;
   a pair of complementary MOSFETs controlled by the digital control interface circuit;
   a pair of supply voltage rails, wherein one of the pair of supply voltage rails is connected to each of the pair of complementary MOSFETs;
   a pair of Zener diodes, wherein one of the pair of Zener diodes is connected to each of the pair of complementary MOSFETs;
   a pair of resistors, wherein one of the pair of resistors is connected in parallel with each of the pair of Zener diodes;
   a pair of complementary voltage blocking-MOSFETs having predetermined gate bias voltages, wherein each of the pair complementary voltage blocking-MOSFETs is attached to a corresponding one pair of complementary MOSFETs.

2. A multi-level high voltage pulse generator integrated circuit comprising in accordance with claim 1 wherein the digital logic-level control interface circuit comprises a direct-coupling gate driver connected to each of the pair of complementary MOSFETs.

3. A multi-level high voltage pulse generator integrated circuit comprising in accordance with claim 1 wherein the pair of supply voltage rails are complementary voltage sources.

4. A multi-level high voltage pulse generator integrated circuit comprising in accordance with claim 1 wherein gate terminals of each of the pair of complementary voltage blocking-MOSFETs is connected to ground.

5. A multi-level high-voltage pulse generator integrated circuit comprising:
   a digital logic-level control interface circuit;
   at least one pair of complementary MOSFETs controlled by the digital control interface circuit;
   at least one pair of supply voltage rails, wherein one of the at least one pair of supply voltage rails is connected to each of the at least one pair of complementary MOSFETs;
   at least one pair of Zener diodes, wherein one of the at least one pair of Zener diodes is connected to each of the at least one pair of complementary MOSFETs;
   at least one pair of resistors, wherein one of the at least one pair of resistors is connected in parallel with each of the at least one pair of Zener diodes;
   at least one pair complementary voltage blocking-MOSFETs having predetermined gate bias voltages, wherein each of the at least one pair complementary voltage blocking-MOSFETs is attached to a corresponding one of the at least one pair of complementary MOSFETs.

6. A multi-level high voltage pulse generate integrated circuit comprising in accordance with claim 5 wherein a number of pairs of complementary MOSFETs is equal to a number of pairs of complementary voltage blocking-MOSFETs to generate an even number of multiple voltage levels.

7. A multi-level high voltage pulse generate integrated circuit comprising in accordance with claim 5 wherein a number of pairs of complementary MOSFETs is unequal to a number of pairs of complementary voltage blocking-MOSFETs to generate an odd number of multiple voltage levels.

8. A multi-level high voltage pulse generator integrated circuit comprising in accordance with claim 5 wherein the digital logic-level control interface circuit comprises direct-coupling gate drivers connected to each of the at least one pair of complementary MOSFETs.

9. A multi-level high voltage pulse generator integrated circuit comprising in accordance with claim 5 wherein the at least one pair of supply voltage rails are complementary voltage sources.

10. A multi-level high voltage pulse generator integrated circuit comprising in accordance with claim 5 wherein the at least one pair of supply voltage rails are shared limited number of complementary voltage sources.

11. A multi-level high voltage pulse generator integrated circuit comprising in accordance with claim 5 wherein gate terminals of each of the at least one pair of complementary voltage blocking-MOSFETs is connected to ground.

* * * * *